(12) United States Patent
Nishiguchi

(10) Patent No.: US 12,051,741 B2
(45) Date of Patent: Jul. 30, 2024

(54) SEMICONDUCTOR DEVICE

(71) Applicant: SUMITOMO ELECTRIC INDUSTRIES, LTD., Osaka (JP)

(72) Inventor: Kenya Nishiguchi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 399 days.

(21) Appl. No.: 17/470,134

(22) Filed: Sep. 9, 2021

(65) Prior Publication Data
US 2022/0085198 A1 Mar. 17, 2022

(30) Foreign Application Priority Data

Sep. 15, 2020 (JP) ................. 2020-154656

(51) Int. Cl.
*H01L 29/778* (2006.01)
*H01L 29/08* (2006.01)
(Continued)

(52) U.S. Cl.
CPC ...... *H01L 29/7786* (2013.01); *H01L 29/0843* (2013.01); *H01L 29/2003* (2013.01);
(Continued)

(58) Field of Classification Search
CPC ............. H01L 29/7786; H01L 29/0843; H01L 29/2003; H01L 29/205; H01L 29/42316; H01L 29/66431; H01L 29/66462; H01L 29/66659; H01L 29/778; H01L 29/7835; H01L 29/7836; H01L 29/7824; H01L 29/78627; H01L 29/7863
See application file for complete search history.

(56) References Cited

U.S. PATENT DOCUMENTS 5,828,101 A  10/1998  Endo
6,507,071 B1 *  1/2003  Tihanyi ................. H01L 29/402
257/E29.279
(Continued)

FOREIGN PATENT DOCUMENTS

JP  08-330601 A  12/1996
JP  2003-534665 A  11/2003
JP  2019-117919 A  7/2019

OTHER PUBLICATIONS

K. Shinohara et al., "GaN-Based Multi-Channel Transistors with Lateral Gate for Linear and Efficient Millimeter-Wave Power Amplifiers", 2019 IEEE/MTT-S International Microwave Symposium, p. 1133-1135.

*Primary Examiner* — Eduardo A Rodela
(74) *Attorney, Agent, or Firm* — Volpe Koenig

(57) ABSTRACT

A semiconductor device includes a semiconductor layer provided on a substrate and including a channel layer, a source region connected to the channel layer and having a sheet resistance smaller than a sheet resistance of the channel layer, a drain region connected to the channel layer and having a sheet resistance smaller than the sheet resistance of the channel layer, a plurality of gates provided between the source region and the drain region, arranged in a direction intersecting an arrangement direction of the source region and the drain region, and embedded from an upper surface of the semiconductor layer to at least the channel layer, wherein a part of the source region has a convexity that faces a region between two adjacent gates among the plurality of gates, and protrudes toward a part of the drain region through the region between the two adjacent gates.

11 Claims, 20 Drawing Sheets

(51) Int. Cl.
  *H01L 29/20* (2006.01)
  *H01L 29/205* (2006.01)
  *H01L 29/423* (2006.01)
  *H01L 29/66* (2006.01)

(52) U.S. Cl.
  CPC ...... *H01L 29/205* (2013.01); *H01L 29/42316* (2013.01); *H01L 29/66462* (2013.01)

(56) References Cited

U.S. PATENT DOCUMENTS

| | | | |
|---|---|---|---|
| 8,604,477 B2* | 12/2013 | Lin | H01L 29/7869 |
| | | | 257/59 |
| 10,249,711 B2 | 4/2019 | Shinohara et al. | |
| 10,388,746 B2* | 8/2019 | Shinohara | H01L 29/1606 |
| 10,403,745 B2* | 9/2019 | Higuchi | H01L 29/66462 |
| 10,833,159 B1* | 11/2020 | Hao | H01L 29/0619 |
| 11,245,002 B2* | 2/2022 | Weis | H01L 29/1095 |
| 11,557,647 B2* | 1/2023 | Marui | H01L 29/0634 |
| 2001/0045578 A1 | 11/2001 | Hueting et al. | |
| 2006/0138454 A1* | 6/2006 | Saito | H01L 29/1066 |
| | | | 257/E29.252 |
| 2013/0105812 A1* | 5/2013 | Ishigaki | H01L 29/42376 |
| | | | 257/192 |
| 2014/0151747 A1* | 6/2014 | Jeon | H01L 29/42316 |
| | | | 257/194 |
| 2019/0198652 A1 | 6/2019 | Kushida et al. | |
| 2021/0234028 A1* | 7/2021 | Detzel | H01L 29/2003 |
| 2022/0085176 A1* | 3/2022 | Shinohara | H01L 29/42316 |
| 2023/0369422 A1* | 11/2023 | Le | H01L 29/2003 |

* cited by examiner

SEMICONDUCTOR DEVICE

CROSS-REFERENCE TO RELATED APPLICATION

This application claims priority based on Japanese Patent Application No. 2020-154656 filed on Sep. 15, 2020, and the entire contents of the Japanese patent application are incorporated herein by reference.

FIELD OF THE INVENTION

The present disclosure relates to a semiconductor device.

BACKGROUND ART

There has been known a FET (Field Effect Transistor) having a plurality of gates which are arranged so as to intersect in a conduction direction of carriers in a channel layer between a source region and a drain region, and are embedded up to the channel layer (U.S. Pat. No. 10,388,746, and 2019 IEEE/MTT-S International Microwave Symposium p. 1133-1135). Note that the technique related to the present disclosure is disclosed in U.S. Pat. No. 10,249,711.

SUMMARY OF THE INVENTION

A semiconductor device includes a semiconductor layer provided on a substrate and including a channel layer, a source region connected to the channel layer and having a sheet resistance smaller than a sheet resistance of the channel layer, a drain region connected to the channel layer and having a sheet resistance smaller than the sheet resistance of the channel layer, a plurality of gates provided between the source region and the drain region, arranged in a direction intersecting an arrangement direction of the source region and the drain region, and embedded from an upper surface of the semiconductor layer to at least the channel layer, wherein a part of the source region has a convexity that faces a region between two adjacent gates among the plurality of gates, and protrudes toward a part of the drain region through the region between the two adjacent gates.

DESCRIPTION OF EMBODIMENTS

Figure 1:
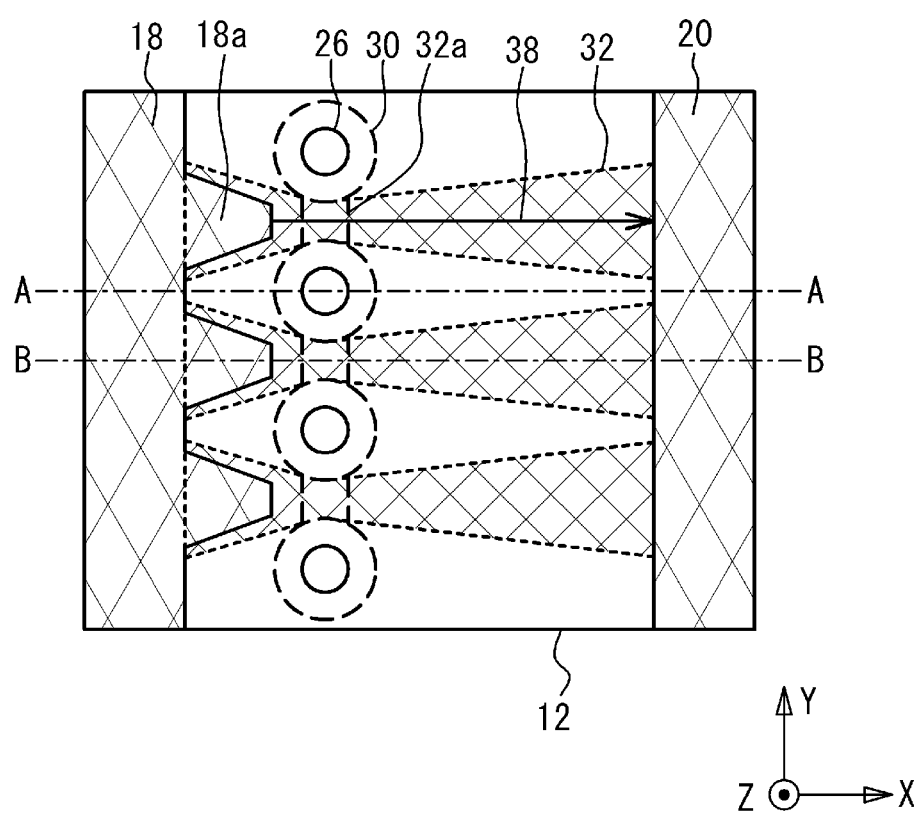
FIG. 1 is a plan view illustrating a semiconductor device according to a first embodiment.

In such an FET, depletion layers extending in a plane direction from the embedded gates control the width of a channel between the gates, thereby controlling a current flowing between the source and drain. It is required to reduce a source resistance in order to improve the FET characteristics. When a distance between the source region and the gate is shortened in order to reduce the source resistance, a parasitic capacitance between the gate and the source increases and the FET characteristics do not improve. Thus, the source resistance and the parasitic capacitance have a trade-off relationship, which makes it difficult to improve the FET characteristics.

It is an object of the present disclosure to provide a semiconductor device that can improve the characteristics.

DESCRIPTION OF EMBODIMENTS OF THE PRESENT DISCLOSURE

First, the contents of embodiments of the present disclosure will be listed and described.

(1) A semiconductor device according to an embodiment of the present disclosure includes: a semiconductor layer provided on a substrate and including a channel layer; a source region connected to the channel layer and having a sheet resistance smaller than a sheet resistance of the channel layer; a drain region connected to the channel layer and having a sheet resistance smaller than the sheet resistance of the channel layer; a plurality of gates provided between the source region and the drain region, arranged in a direction intersecting an arrangement direction of the source region and the drain region, and embedded from an upper surface of the semiconductor layer to at least the channel layer; wherein a part of the source region has a convexity that faces a region between two adjacent gates among the plurality of gates, and protrudes toward a part of the drain region through the region between the two adjacent gates. Thereby, the characteristics of the semiconductor device can be improved.

(2) It is preferable that the convexity does not overlap first straight lines extending in the arrangement direction through the centers of the two adjacent gates, but overlaps a second straight line extending in the arrangement direction through a midpoint between the two adjacent gates in a plan view.

(3) It is preferable that a length of the convexity in the arrangement direction is 1/10 or more and 1 or less of a distance between the source region and each of the two adjacent gates on the first straight lines.

(4) It is preferable that a width of the convexity narrows from the part of the source region toward the drain region.

(5) It is preferable that a width of the convexity gradually narrows from the part of the source region toward the drain region.

(6) It is preferable that a width of the convexity narrows stepwise from the part of the source region toward the drain region.

(7) It is preferable that the part of the drain region through the region between the two adjacent gates has another convexity that projects toward the part of the source region.

(8) When the above (7) is satisfied, it is preferable that the another convexity does not overlap first straight lines extending in the arrangement direction through the centers of the two adjacent gates, but overlaps a second straight line extending in the arrangement direction through a midpoint between the two adjacent gates in a plan view.

(9) It is preferable that the semiconductor layer has an energy of the bottom of a conduction band higher than an energy of the bottom of a conduction band in the channel layer, and includes a barrier layer laminated on the channel layer.

(10) It is preferable that the semiconductor layer includes a plurality of laminated channel layers.

(11) When the above (8) is satisfied, it is preferable that a length of the another convexity in the arrangement direction is 1/10 or more and 1 or less of a distance between the drain region and each of the two adjacent gates on the first straight lines.

(12) When the above (7) is satisfied, it is preferable that a width of the another convexity narrows from the part of the drain region toward the part of source region.

DETAILS OF EMBODIMENTS OF THE PRESENT DISCLOSURE

A description will be given of embodiments of the method for manufacturing the semiconductor device according to embodiments of the present disclosure, with reference to drawings. The present disclosure is not limited to the specifically disclosed embodiments and variations but may include other embodiments and variations without departing from the scope of the present invention.

First Embodiment

Figure 2:
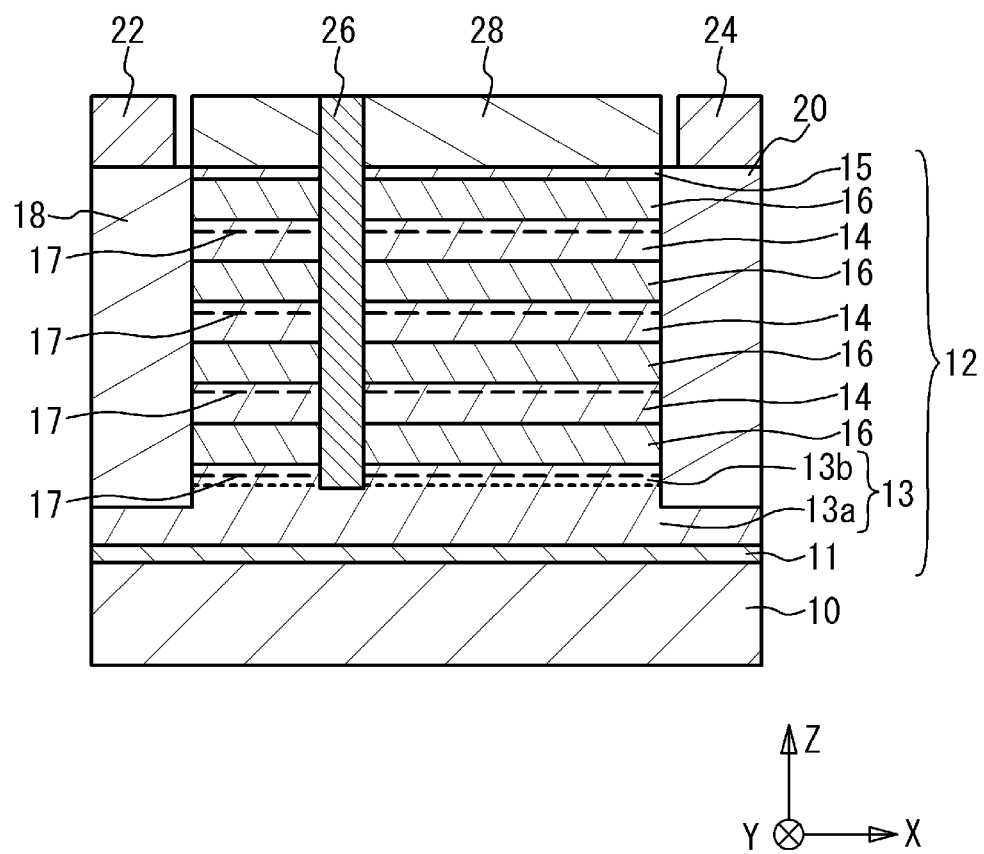
FIG. 2 is a cross-sectional view taken along a line A-A of FIG. 1.
Figure 3:
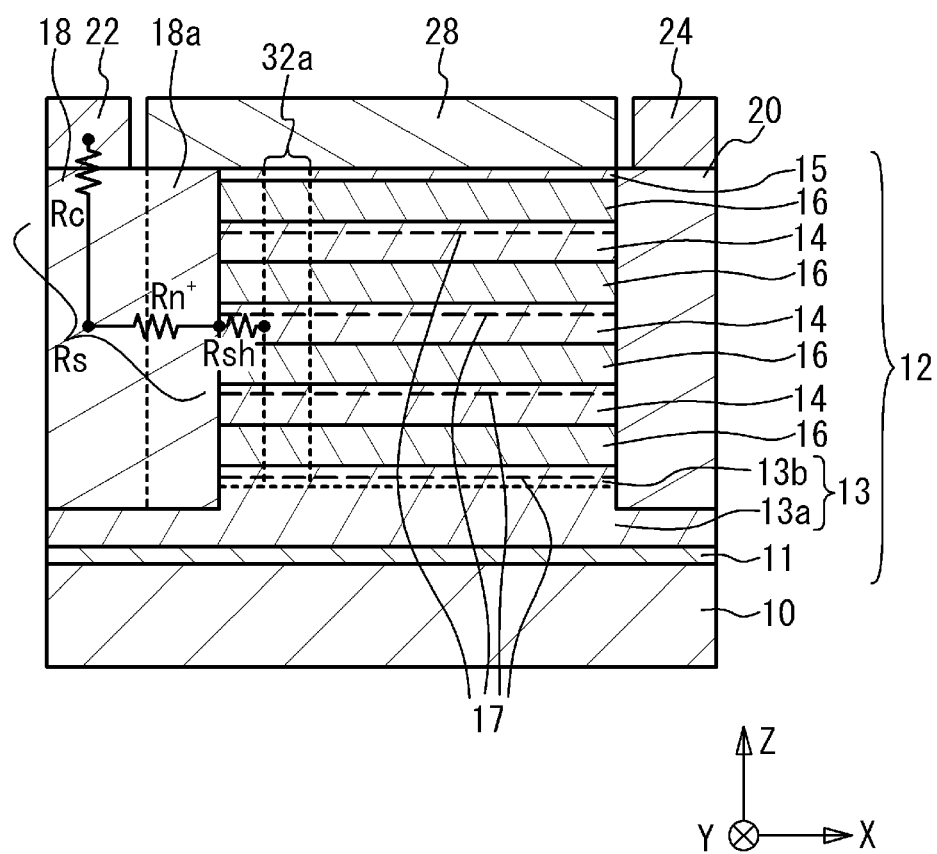
FIG. 3 is a cross-sectional view taken along a line B-B of FIG. 1.

FIG. 1 is a plan view illustrating a semiconductor device according to a first embodiment. FIG. 2 is a cross-sectional view taken along a line A-A of FIG. 1 and FIG. 3 is a cross-sectional view taken along a line B-B of FIG. 1. In FIG. 1, depletion layers 30 are illustrated by broken lines, and a source electrode 22, a drain electrode 24 and an insulating film 28 are not illustrated. A stacking direction of a substrate 10 and a semiconductor layer 12 is defined as a Z direction. A direction which is parallel to upper surfaces (main surface) of the substrate 10 and the semiconductor layer 12 and in which carriers conduct from a source region 18 to a drain region 20 is defined as an X direction. A direction which is orthogonal to the X direction and in which gate electrodes 26 are aligned is defined as a Y direction.

As illustrated in FIGS. 1 to 3, the semiconductor layer 12 is provided on the substrate 10. A nucleation layer 11, a buffer layer 13a, a channel layer 13b, a barrier layer 16, three channel layers 14 and three barrier layers 16, and a cap layer 15 are laminated in this order on the substrate 10 as the semiconductor layer 12. The three channel layers 14 and the three barrier layers 16 are alternately laminated. The source region 18 and the drain region 20 that reach the buffer layer 13a from an upper surface of the cap layer 15 are formed on the semiconductor layer 12. The source electrode 22 and the drain electrode 24 that are in electrical contact with the source region 18 and the drain region 20 are provided on the source region 18 and the drain region 20, respectively. The insulating film 28 is provided on the semiconductor layer 12 between the source region 18 and the drain region 20. The plurality of gates 26 are provided between the source region 18 and the drain region 20 and are arranged in the Y direction. A planar shape of each gate 26 is circular. The source region 18 has a convexity 18a which protrudes in the X direction between the gates 26. A planar shape of the convexity 18a is a trapezoidal shape in which a width in the Y direction narrows along the +X direction.

The substrate 10 is, for example, a SiC substrate, a sapphire substrate, or a GaN substrate. An upper surface of the substrate 10 is, for example, a (0001) plane. The semiconductor layer 12 is, for example, a nitride semiconductor layer. The nucleation layer 11 is, for example, an AlN layer. The buffer layer 13a and the channel layer 13b are, for example, a GaN layer 13 having a thickness of 292 nm. The buffer layer 13a and the channel layer 13b are the same GaN layer 13, but a lower part of the GaN layer 13 functions as the buffer layer 13a and an upper part of the GaN layer 13 functions as the channel layer 13b. Therefore, the GaN layer 13 will be described as the buffer layer 13a and the channel layer 13b, for convenience.

The channel layer 14 is, for example, a GaN layer having a thickness of 15 nm. The cap layer 15 is, for example, a GaN layer having a thickness of 3 nm. The barrier layer 16 is, for example, an AlGaN layer having a thickness of 15 nm. No dopant is intentionally added to the buffer layer 13a, the channel layers 13b and 14, the cap layer 15 and the barrier layer 16, and a dopant concentration is, for example, $1 \times 10^{16}$ cm$^{-3}$ or less. The dopant may be intentionally added to the barrier layer 16. The dopant concentration in the barrier layer 16 may be, for example, $1 \times 10^{16}$ cm$^{-3}$ or more.

Each of the source region 18 and the drain region 20 has a sheet resistance lower than that of the semiconductor layer 12, for example, silicon is added as the dopant, and the dopant concentration is, for example, $1 \times 10^{19}$ cm$^{-3}$ or more. As an example, the sheet resistance of the semiconductor layer 12 between the source region 18 and the drain region 20 is 500Ω/□ or more, and the sheet resistance of each of the source region 18 and the drain region 20 is 100Ω/□ or less. In the semiconductor layer 12, the channel layers 13b and 14 contribute to the conduction of carriers. Therefore, the sheet resistance of the semiconductor layer 12 is substantially equal to the total of the sheet resistances of the channel layers 13b and 14.

Each of the source electrode 22 and the drain electrode 24 includes, for example, a titanium film and an aluminum film from the semiconductor layer 12 side (i.e., in this order from a position close to the semiconductor layer 12). The gate 26 includes, for example, a nickel film and a gold film from the semiconductor layer 12 side (i.e., in this order from a position close to the semiconductor layer 12). The insulating film 28 is, for example, a silicon nitride film, a silicon oxide film, or a silicon nitride oxide film.

A bandgap of the channel layers 13b and 14 is smaller than that of the barrier layer 16, and the energy of the bottom of the conduction band of the channel layers 13b and 14 is lower than that of the bottom of the conduction band of the barrier layer 16. At an interface between the channel layers 13b and 14 and the barrier layer 16, two dimensional electron gas (2DEG) 17 corresponding to a polarization difference between the channel layers 13b and 14 and the barrier layer 16 is generated. In the channel layers 13b and 14, the 2DEG 17 contributes to the conduction of electrons.

As illustrated in FIG. 1, each of depletion layers 30 is formed around the gate 26 in response to a gate voltage applied to the gate 26. The 2DEG 17 is hardly formed in the channel layers 13b and 14 in the depletion layer 30. The 2DEG 17 is formed in the channel layers 13b and 14 in a region other than the depletion layer 30. The 2DEG 17 in a region 32 mainly contributes to the conduction of the carriers from the source region 18 to the drain region 20 (see an arrow 38). The 2DEG 17 in regions other than the region 32 does not contribute much to the conduction of the carriers. The convexity 18a is not provided outside the region 32. A region 32a is a part of the region 32 sandwiched between two adjacent gates 26, and is an effective channel region whose width in the Y direction is controlled by two adjacent depletion layers 30.

As illustrated in FIG. 3, a resistance between an end of the region 32a in the X direction near the source electrode 22 and the source electrode 22 is a source resistance Rs, and Rs=Rc+Rn$^+$+Rsh is satisfied. The Rc is a contact resistance between the source electrode 22 and the source region 18, the Rn+ is a total resistance of the source region 18 and the convexity 18a protruding in the X direction, and the Rsh is the resistance of a portion of the channel layers 13b and 14.

Example 1 of Manufacturing Method of First Embodiment

FIGS. 4A to 4D are cross-sectional views illustrating a manufacturing method according to the first embodiment. FIG. 5 is a plan view illustrating the manufacturing method according to the first embodiment. FIGS. 4A to 4D correspond to an A-A cross section of FIGS. 1 and 5.

Figure 4A:
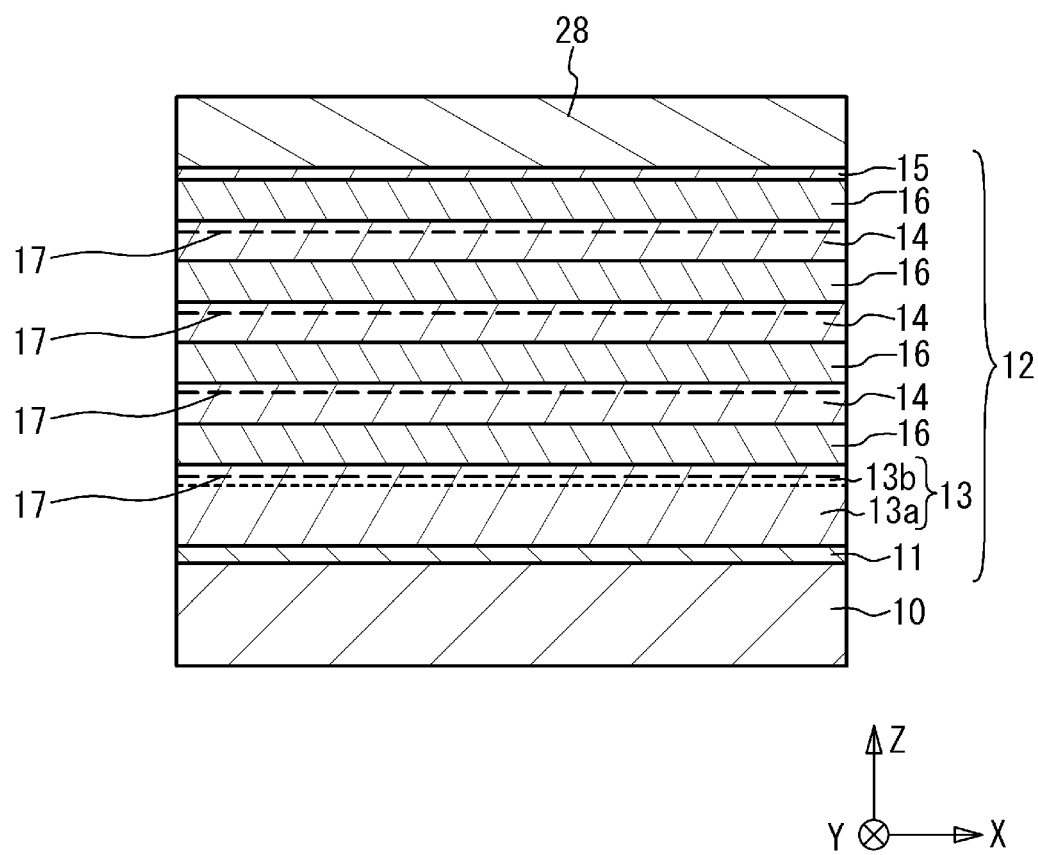
FIG. 4A is a cross-sectional view illustrating a manufacturing method according to the first embodiment (No. 1).
Figure 5:
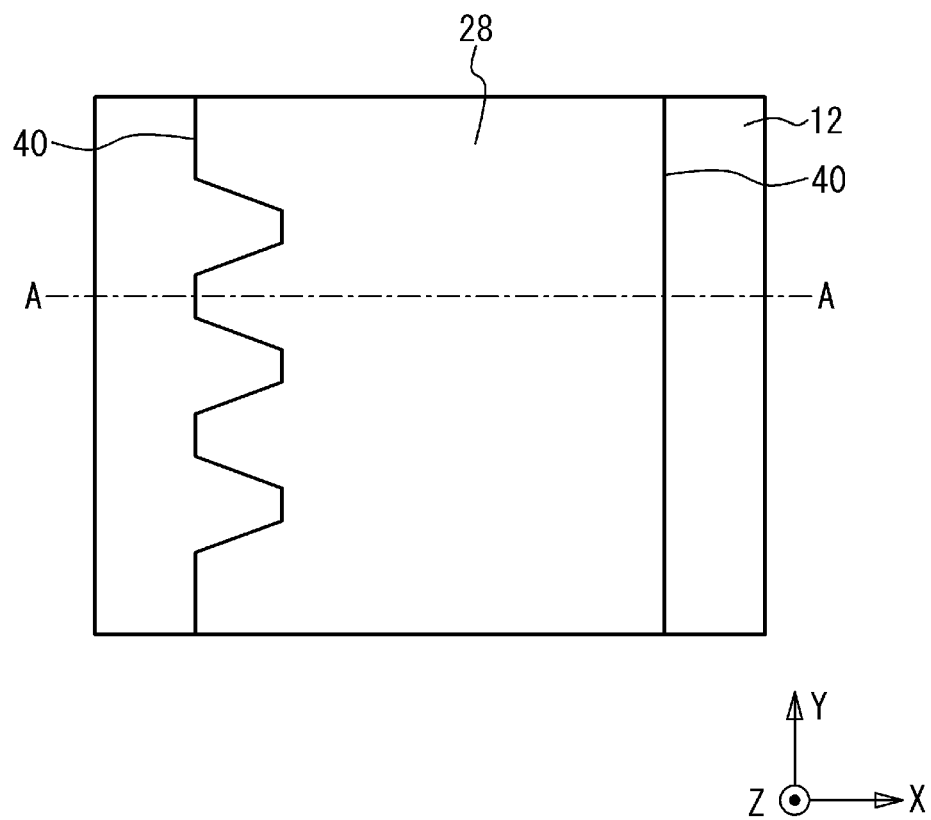
FIG. 5 is a plan view illustrating the manufacturing method according to the first embodiment.

As illustrated in FIG. 4A, the semiconductor layer 12 is formed on the substrate 10 by using, for example, a MOCVD (Metal Organic Chemical Vapor Deposition) method. The layer structure of the semiconductor layer 12 is the same as that in FIGS. 2 and 3. The insulating film 28 is formed on the semiconductor layer 12 by using, for example, a CVD (Chemical Vapor Deposition) method.

Figure 4B:
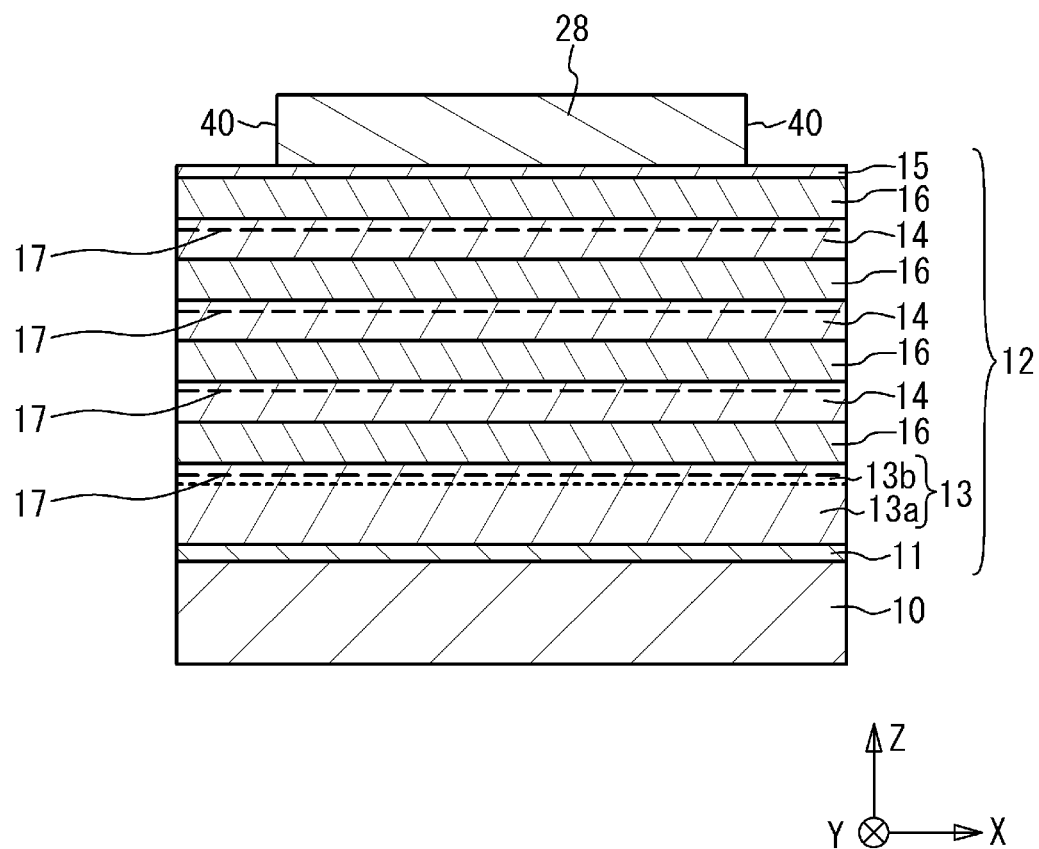
FIG. 4B is a cross-sectional view illustrating the manufacturing method according to the first embodiment (No. 2).

As illustrated in FIGS. 4B and 5, the insulating film 28 is removed using, for example, a dry etching method to form openings 40. The openings 40 are formed in regions where the source region 18 and the drain region 20 are to be formed. Thereby, the upper surface of the semiconductor layer 12 is exposed from the openings 40.

Figure 4C:
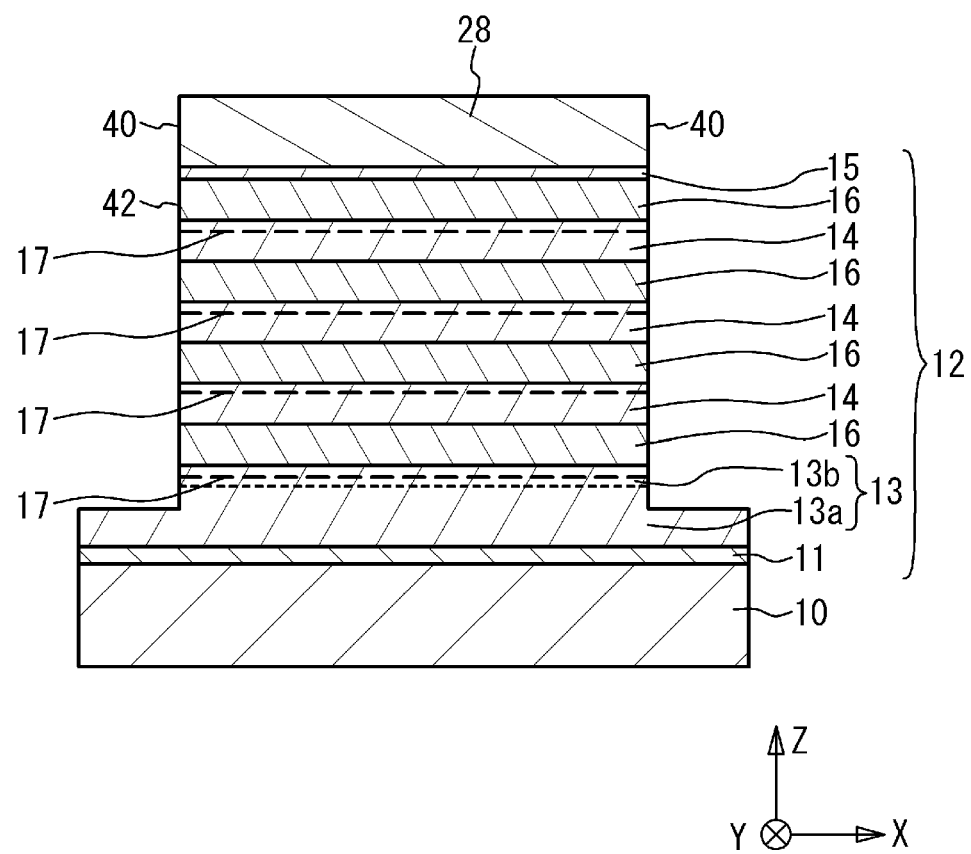
FIG. 4C is a cross-sectional view illustrating the manufacturing method according to the first embodiment (No. 3).

As illustrated in FIG. 4C, grooves 42 are formed in the semiconductor layer 12 using the insulating film 28 as a mask. The grooves 42 are defined by the openings 40 and are formed so as to penetrate at least the channel layers 13b and 14.

Figure 4D:
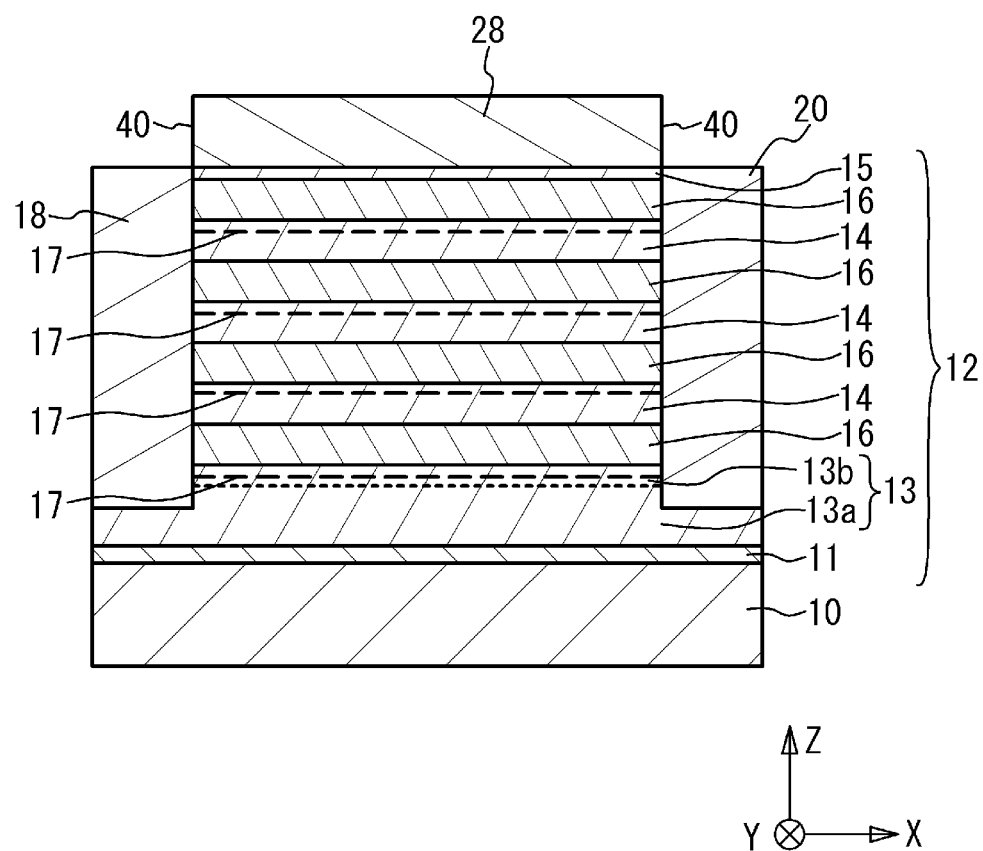
FIG. 4D is a cross-sectional view illustrating the manufacturing method according to the first embodiment (No. 4).

As illustrated in FIG. 4D, GaN layers including, for example, silicon of $1\times10^{19}$ cm$^3$ or more are re-grown as the source region 18 and the drain region 20 in the grooves 42 using the insulating film 28 as the mask. For example, the MOCVD method is used for the growth of the source region 18 and the drain region 20. Then, a hole is formed in the insulating film 28 and the semiconductor layer 12, and the gate 26 is formed in the hole. The source electrode 22 and the drain electrode 24 are formed on the source region 18 and the drain region 20, respectively. As described above, the semiconductor device according to the first embodiment is formed.

Example 2 of Manufacturing Method of First Embodiment

In an example 2 of the manufacturing method of the first embodiment, after FIG. 4B, the dopant such as silicon is ion-implanted into the semiconductor layer 12 using the insulating film 28 as the mask. Then, a heat treatment to activate the dopant is performed to form the source region 18 and the drain region 20 in the semiconductor layer 12, as illustrated in FIG. 4D. Other steps are the same as those in the example 1 of the manufacturing method of the first embodiment, and the description thereof will be omitted.

First Comparative Example

Figure 6:
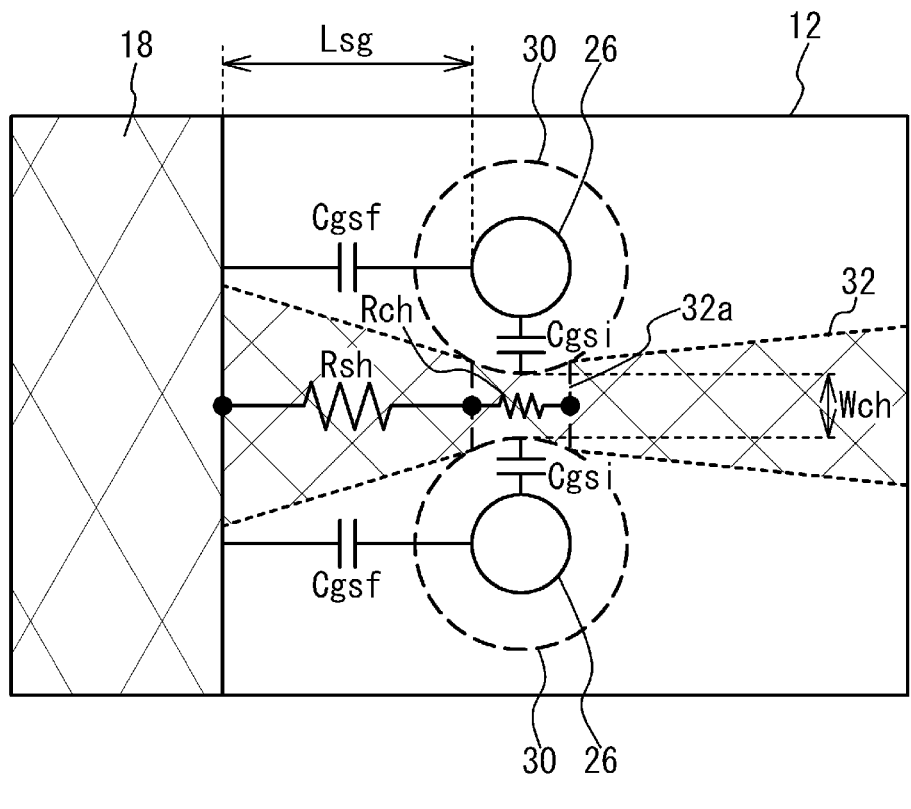
FIG. 6 is an enlarged plan view of a semiconductor device according to a first comparative example.
Figure 7:
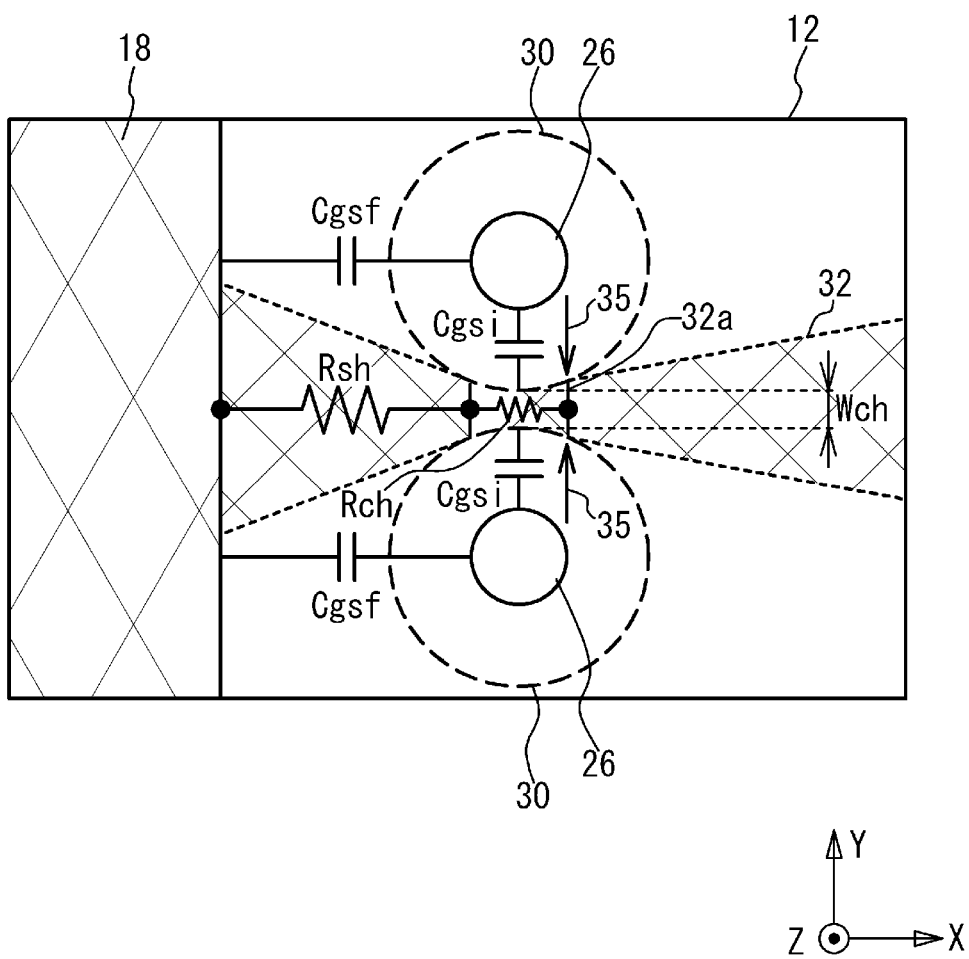
FIG. 7 is an enlarged plan view of the semiconductor device according to the first comparative example.

FIGS. 6 and 7 are enlarged plan views of a semiconductor device according to a first comparative example. FIGS. 6 and 7 illustrate an enlarged state of region around the two gates 26. As illustrated in FIG. 6, the carriers (electrons) conduct through the channel layers 13b and 14 in the region 32. In the region 32 between the gates 26, a width Wch (channel width) of the region 32a is determined by the depletion layers 30 extending from both gates 26 in the Y direction.

When negative voltages are applied to the gates 26, the depletion layers 30 expand as indicated by arrows 35 in FIG. 7. Thereby, the width Wch of the region 32a is narrowed. In this way, the widths of the depletion layers 30 are controlled by the voltages of the gates 26, and the current flowing through the region 32a is controlled.

As illustrated in FIGS. 6 and 7, a resistance between an end of the region 32a near the source electrode 22 and an end of the region 32a near the drain electrode 24 is Rch. A resistance between the end of the region 32a near the source electrode 22 and the source region 18 is Rsh. A gate-source capacitance Cgs in which the gates 26 change the width Wch of the region 32a is a true capacitance Cgsi. A capacitance between the source region 18 other than the true capacitance Cgsi and the gate 26 is a parasitic capacitance Cgsf. The parasitic capacitance Cgsf includes a capacitance between the gate 26 and the source electrode 22 outside the semiconductor layer 12 and a capacitance between the gate 26 and the source region 18 inside the semiconductor layer 12 excluding the true capacitance Cgsi. A distance between the source region 18 and the gate 26 is Lsg.

A cutoff frequency $f_T$ is represented by $f_T \approx gm/(2\pi Cgs)$ as an index of the high frequency characteristics of the FET, wherein gm is a mutual conductance, Cgs is the gate-source capacitance, and Cgs=Cgsi+Cgsf. When the resistance Rsh becomes larger, the gm becomes small and the $f_T$ becomes lower. Further, when the resistance Rsh is large, an on-resistance (non-saturated source-drain current) becomes larger.

Second Comparative Example

Figure 8:
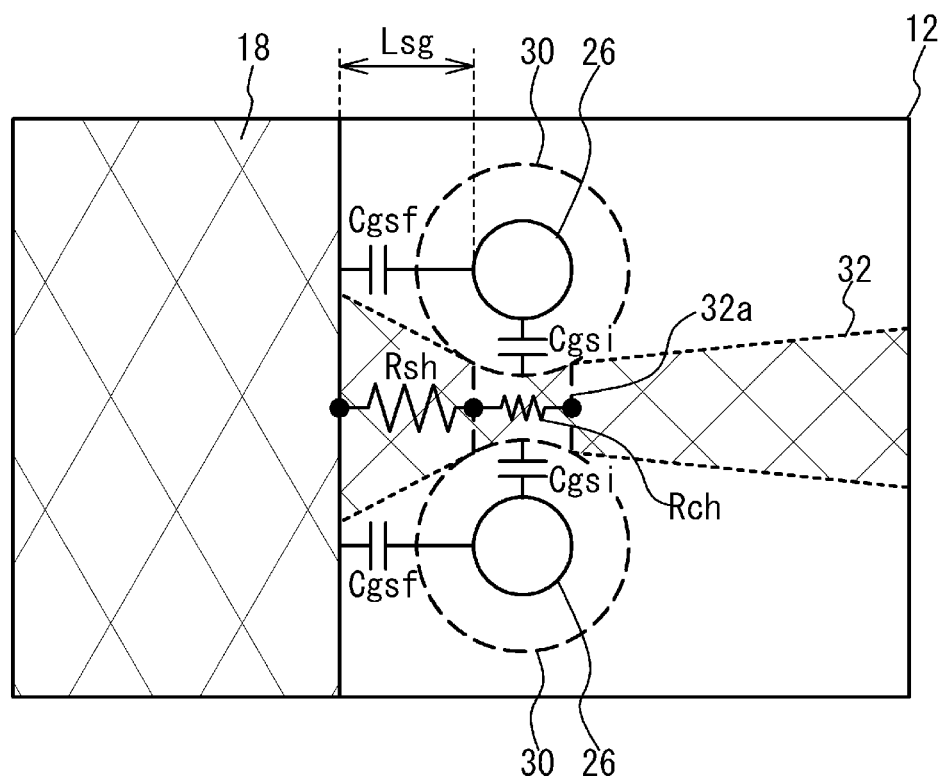
FIG. 8 is an enlarged plan view of a semiconductor device according to a second comparative example.
Figure 8:
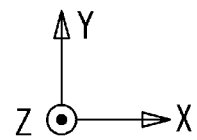

FIG. 8 is an enlarged plan view of a semiconductor device according to a second comparative example. As illustrated in FIG. 8, the distance Lsg between the source region 18 and the gate 26 is shortened. Thereby, The resistance Rsh becomes smaller, the gm becomes larger, and the on-resistance becomes smaller. However, as the distance Lsg becomes shorter, the parasitic capacitance Cgsf becomes larger. For example, when the relative dielectric constant of GaN is 9.5 and the Lsg is 1 µm, the Cgsf is calculated to be about 8.5 nF/cm$^2$ using the parallel plate approximation. When the Lsg is 0.8 µm, the Cgsf is about 10.5 nF/cm$^2$. In this way, when the distance Lsg is shortened so that the resistance Rsh decreases, the gm increases and the on-resistance decreases, the parasitic capacitance Cgsf increases and the f$_T$ decreases. Thus, the source resistance Rs and the parasitic capacitance Cgsf are in trade-off relation, and hence it is difficult to improve the FET characteristics.

Figure 9:
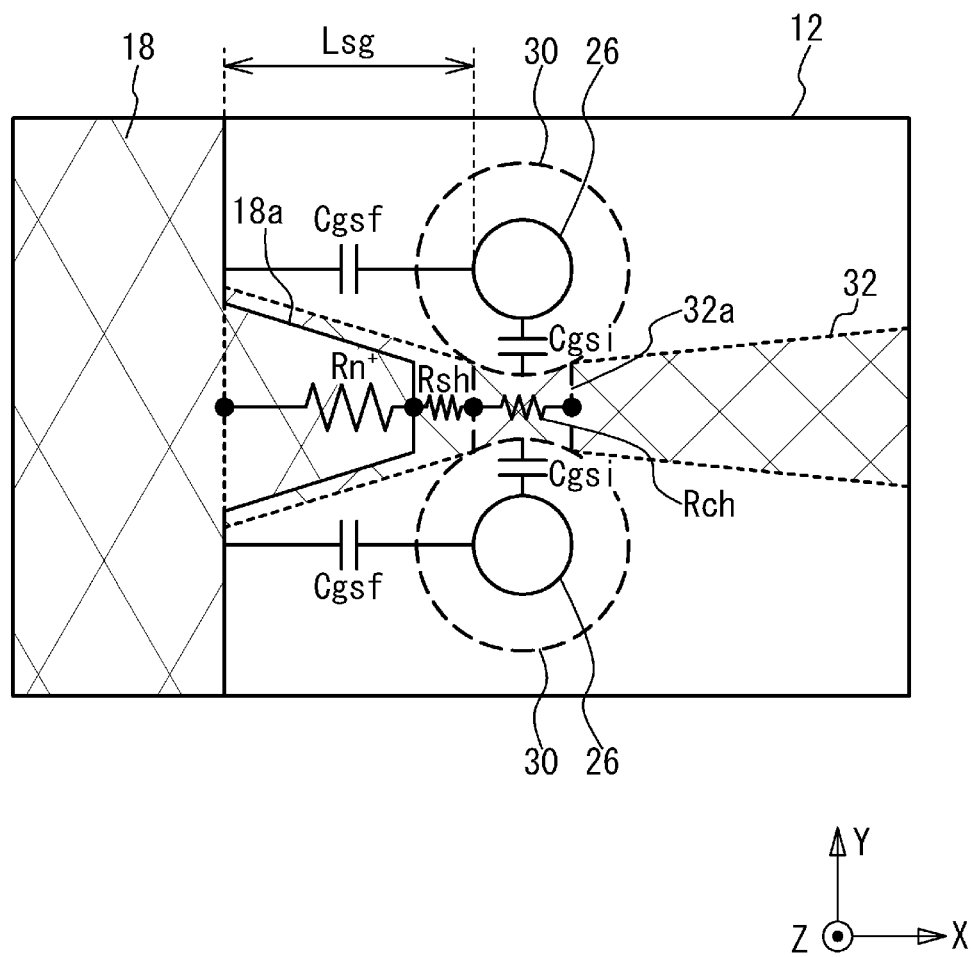
FIG. 9 is an enlarged plan view of the semiconductor device according to the first embodiment.
Figure 10:
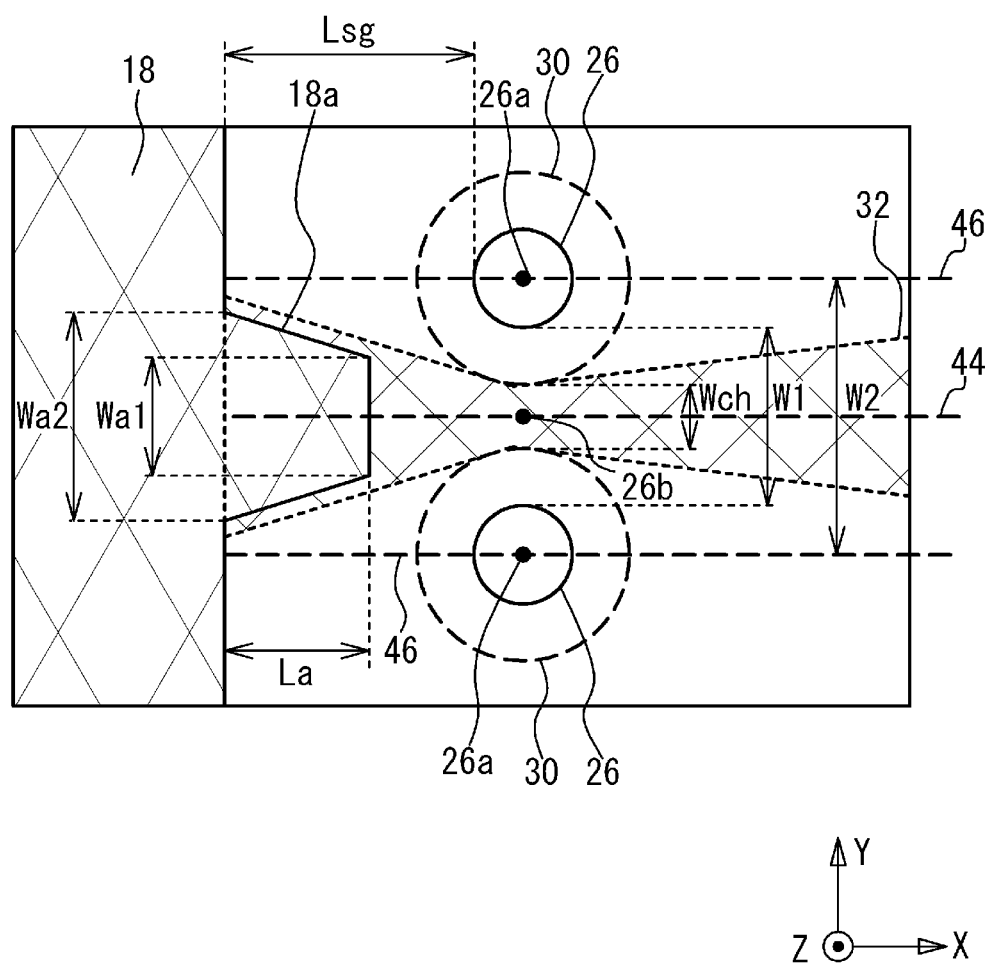
FIG. 10 is an enlarged plan view of the semiconductor device according to the first embodiment.

FIGS. 9 and 10 are enlarged plan view of the semiconductor device according to the first embodiment. In the first embodiment, the source region 18 has the convexity 18a as illustrated in FIG. 9. The convexity 18a is provided so as to be included in the region 32. When the distance Lsg of the first embodiment is substantially the same as that of the first comparative example, the parasitic capacitance Cgsf the first embodiment is substantially the same as that of the first comparative example. On the other hand, the sheet resistance in the convexity 18a is smaller than that in the region 32. Therefore, since the resistance Rn$^+$ of the convexity 18a becomes smaller, the source resistance Rs becomes smaller in the first embodiment than in the first comparative example. Thereby, the gm can be larger, the on-resistance can be smaller, the parasitic capacitance Cgsf can be smaller, and the f$_T$ can be higher.

As described above, according to the first embodiment, the semiconductor layer 12 includes the channel layers 13b and 14. The source region 18 and the drain region 20 are connected to the channel layers 13b and 14. The sheet resistance of each of the source region 18 and the drain region 20 is smaller than that of each of the channel layers 13b and 14. The plurality of gates 26 are provided between the source region 18 and the drain region 20, are arranged in a direction intersecting an arrangement direction (X direction) of the source region 18 and the drain region 20, and are embedded from the upper surface of the semiconductor layer 12 to at least the channel layers 13b and 14.

In such a configuration, a part of the source region 18 has the convexity 18a that faces the region between two adjacent gates 26 among the plurality of gates 26 and protrudes in the direction of the opposite drain region 20 through the two adjacent gates 26. Thereby, the gm can be larger, the on-resistance can be smaller, the parasitic capacitance Cgsf can be smaller, and the f$_T$ can be higher. Therefore, the characteristics of the FET can be improved. In order to reduce the source resistance Rs, the sheet resistance of each of the source region 18 and the drain region 20 is preferably ½ or less, more preferably ⅕ or less of the sheet resistance of each of the channel layers 13b and 14. In order to prevent the sheet resistance of each of the channel layers 13b and 14 from becoming too large, the sheet resistance of each of the source region 18 and the drain region 20 is preferably ¹⁄₁₀₀ or more of the sheet resistance of each of the channel layers 13b and 14.

As illustrated in FIG. 10, an interval between the two adjacent gates 26 facing each other in the Y direction is W1, an interval between centers 26a of the two adjacent gates 26 in the Y direction is W2, a length of the convexity 18a in the X direction is La, a minimum width of the convexity 18a in the Y direction is Wa1, and a maximum width of the convexity 18a in the Y direction is Wa2. The interval W1 is, for example, 100 nm to 500 nm, and 250 nm as an example. The interval W2 is, for example, 200 nm to 1000 nm, and 400 nm as an example.

Increasing the planar shape of the convexity 18a reduces the source resistance Rs. However, when the convexity 18a is located outside the region 32, the parasitic capacitance Cgsf becomes larger than that of first comparative example. In particular, when the convexity 18a is included in the depletion layer 30, the parasitic capacitance Cgsf becomes larger. From the viewpoint of reducing the parasitic capacitance Cgsf, the length La of the convexity 18a in the X direction is preferably a distance Lsg or less, and more preferably 0.8×Lsg or less. From the viewpoint of reducing the source resistance Rs, the length La is preferably ¹⁄₁₀×Lsg or more, and more preferably ⅕×Lsg or more. From the viewpoint of reducing the source resistance Rs, the convexity 18a preferably overlaps with a straight line 44 extending in the X direction through a midpoint 26b between the gates 26, the width Wa1 is preferably ¹⁄₁₀×W1 or more, and the width Wa2 is preferable ¹⁄₁₀×W2 or more. From the viewpoint of reducing the parasitic capacitance Cgsf, the convexity 18a preferably does not overlap with straight lines 46 extending in the X direction through centers 26a of the gates 26, the width Wa1 is preferably ½×W1 or less, and the width Wa2 is preferably ½×W2 or less.

First Variation of First Embodiment

Figure 11:
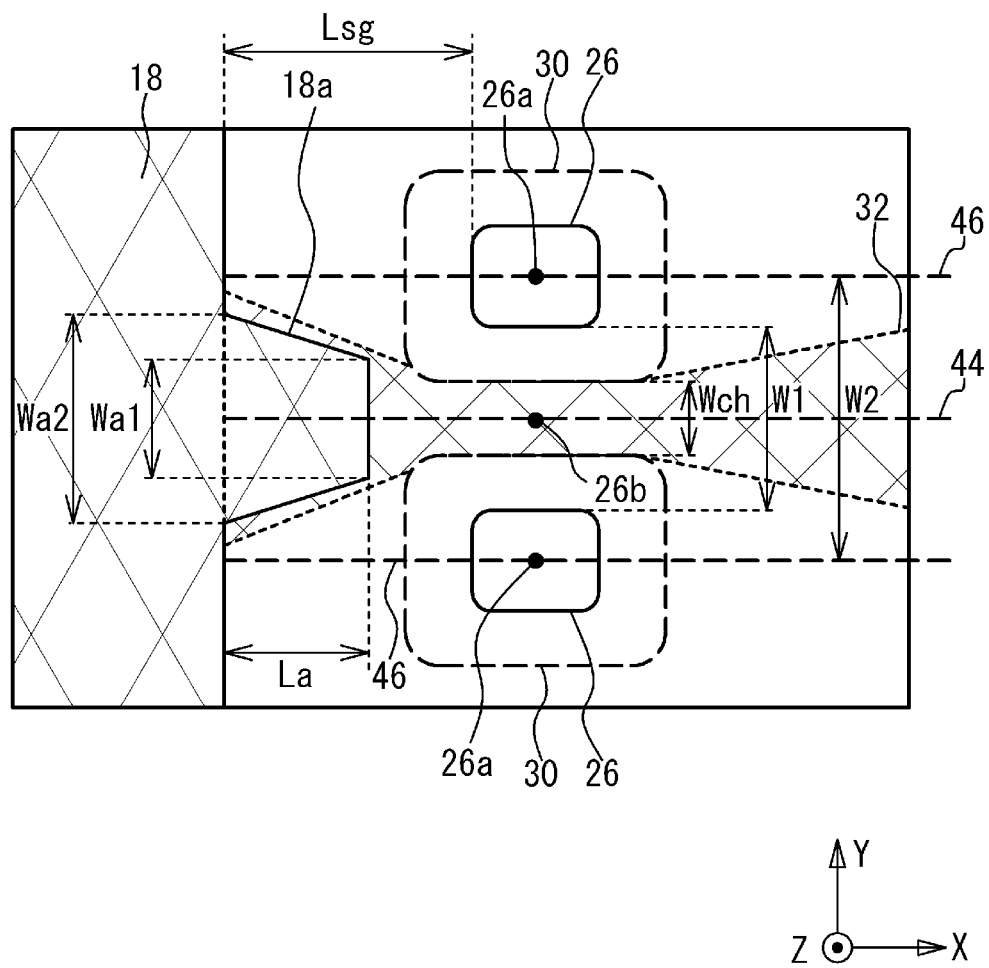
FIG. 11 is an enlarged plan view of a semiconductor device according to a first variation of the first embodiment.

FIG. 11 is an enlarged plan view of a semiconductor device according to a first variation of the first embodiment. As illustrated in FIG. 11, the planar shape of the gate 26 may be an approximate rectangle. It is preferable that the long sides of the rectangle are extended in the X direction and the short sides are extended in the Y direction. Other configurations are the same as those in the first embodiment, and the description thereof will be omitted. The planar shape of the gate 26 may be an ellipse or elongated circle in addition to a circle and an approximate rectangle.

Second Variation of First Embodiment

Figure 12:
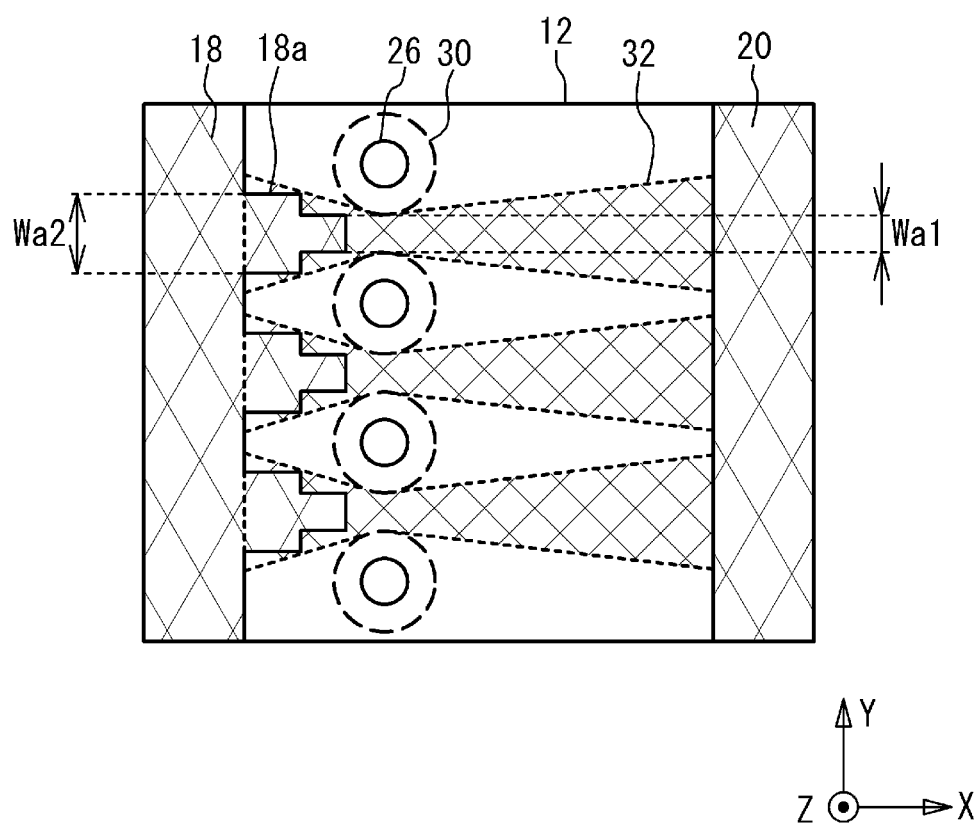
FIG. 12 is an enlarged plan view of a semiconductor device according to a second variation of the first embodiment.

FIG. 12 is an enlarged plan view of a semiconductor device according to a second variation of the first embodiment. As illustrated in FIG. 12, the planar shape of the convexity 18a is a shape in which a plurality of rectangles are connected to each other in the X direction. The sides of the rectangle substantially extend in the X direction and the Y direction. The width of the rectangle on a +X side is Wa1, and the width of the rectangle on a −X side is Wa2. Other configurations are the same as those in the first embodiment, and the description thereof will be omitted.

Third Variation of First Embodiment

Figure 13:
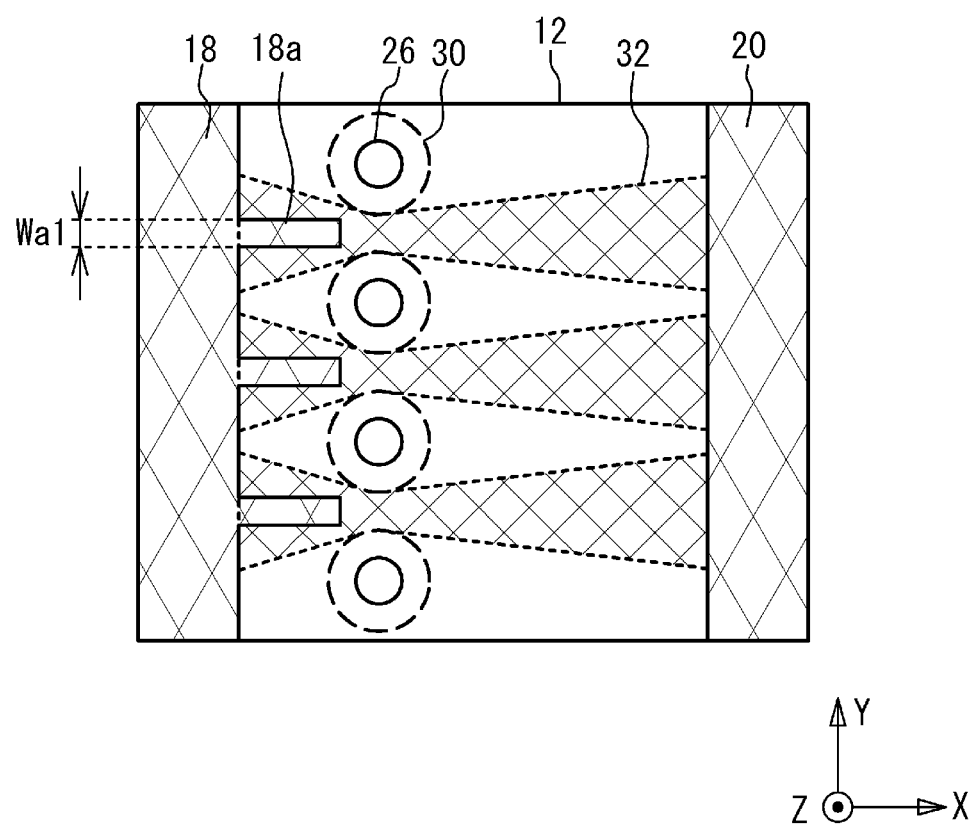
FIG. 13 is an enlarged plan view of a semiconductor device according to a third variation of the first embodiment.

FIG. 13 is an enlarged plan view of a semiconductor device according to a third variation of the first embodiment. As illustrated in FIG. 13, the planar shape of the convexity 18a is the rectangle, and the sides of the rectangle substantially extend in the X direction and the Y direction. The width Wa1 of the convexity 18a in the Y direction is substantially constant. Other configurations are the same as those in the first embodiment, and the description thereof will be omitted.

The source resistance is smallest in the first embodiment, and increases in the order of the first embodiment, the second variation of the first embodiment, and the third variation of the first embodiment. When the convexity 18a deviates from the region 32, the parasitic capacitance Cgsf increases. Therefore, the risk of increasing the parasitic capacitance Cgsf is highest in the first embodiment, and decreases in the order of the first embodiment, the second variation of the first embodiment, and the third variation of the first embodiment. On the −X side of the gate 26, the width of the region 32 in the Y direction gradually increases toward the −X direction. Therefore, it is preferable that the width of the convexity 18a in the Y direction narrows from the part of the source region 18 toward the drain region 20 as in the first embodiment and the second variation thereof. As in the first embodiment, the width of the convexity 18a in the Y direction may be gradually narrowed from the source region 18 toward the drain region 20. As in the second variation of the first embodiment, the width of the convexity 18a in the Y direction may be narrowed stepwise from the source region 18 to the drain region 20. In the first embodiment, the width of the convexity 18a in the Y direction is linearly narrowed from the source region 18 toward the drain region 20, but may be curvilinearly narrowed from the source region 18 to the drain region 20.

Fourth Variation of First Embodiment

Figure 14:
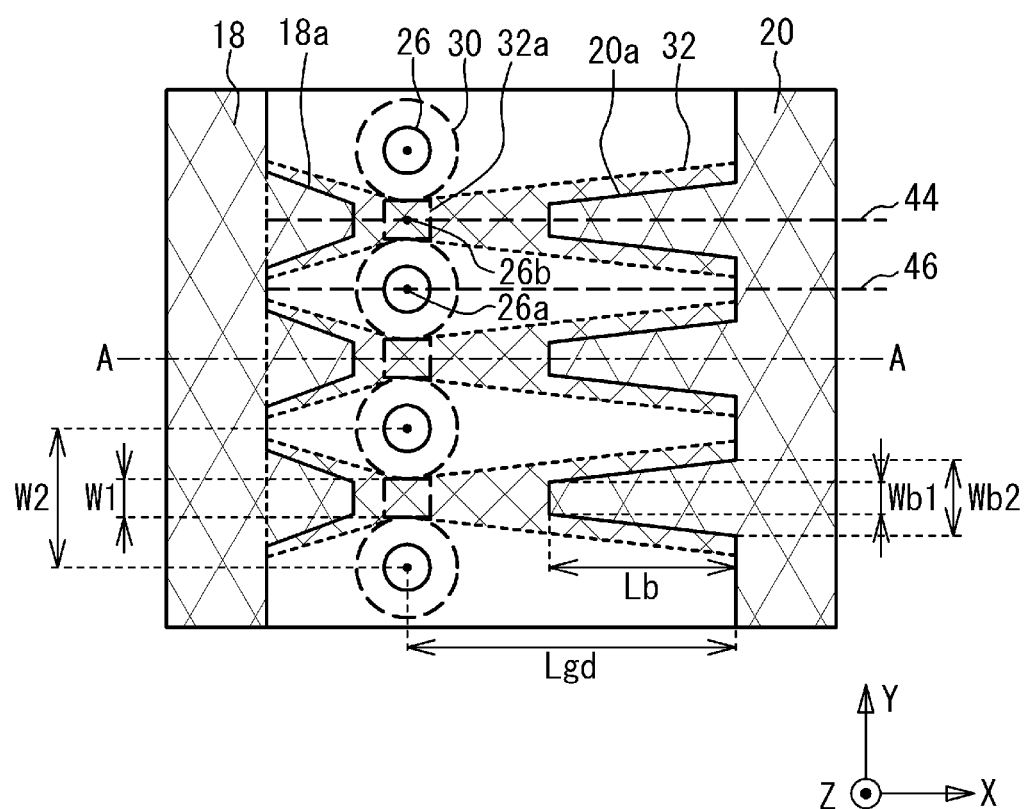
FIG. 14 is an enlarged plan view of a semiconductor device according to a fourth variation of the first embodiment.
Figure 15:
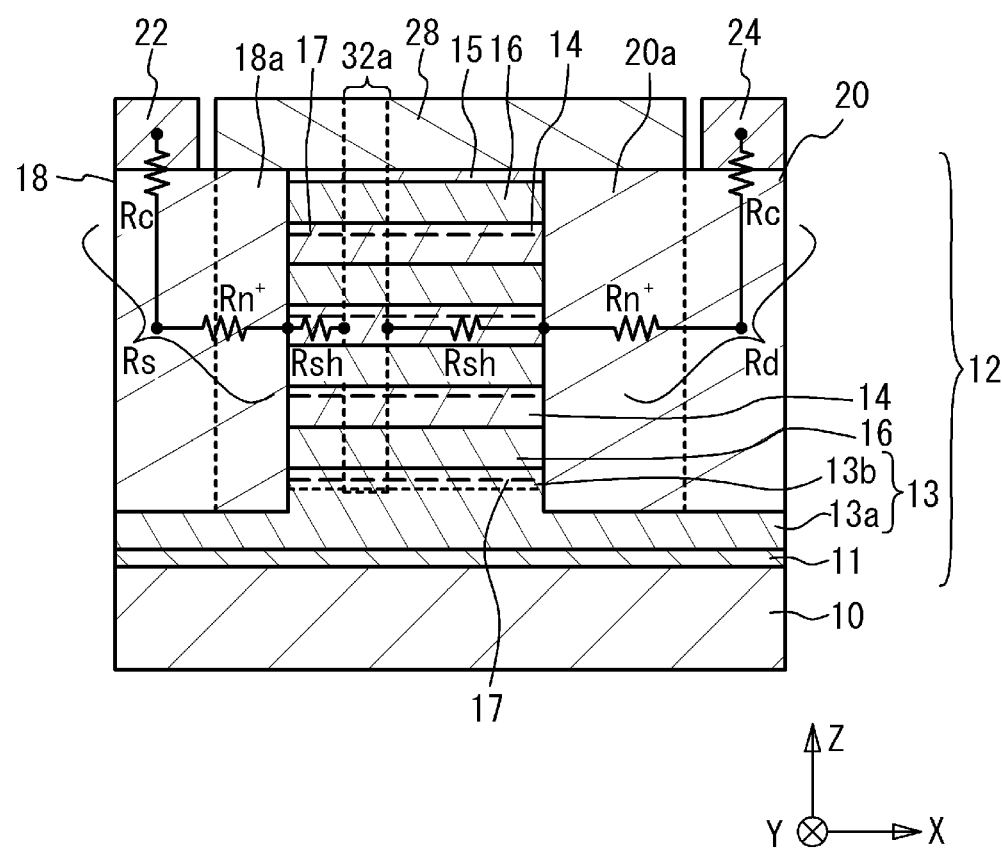
FIG. 15 is a cross-sectional view taken along a line A-A of FIG. 14.

FIG. 14 is an enlarged plan view of a semiconductor device according to a fourth variation of the first embodiment. FIG. 15 is a cross-sectional view taken along a line A-A of FIG. 14. In FIG. 15, the position of the region 32a is indicated by a broken line. In the fourth variation of the first embodiment, a part of the drain region 20 has a convexity 20a protruding toward the part of the source region 18 as illustrated in FIGS. 14 and 15. Other configurations are the same as those in the first embodiment, and the description thereof will be omitted.

As illustrated in FIG. 15, the source resistance Rs between the region 32a and the source electrode 22 is Rc+Rn$^+$+Rsh. The Rc is the contact resistance between the source electrode 22 and the source region 18, the Rn$^+$ is the resistance of the source region 18, and the Rsh is the resistance of the channel layers 13b and 14. A drain resistance Rd between the region 32a and the drain electrode 24 is Rc+Rn$^+$+Rsh. The Rc is the contact resistance between the drain electrode 24 and the drain region 20, The Rn$^+$ is the resistance of the drain region 20, and Rsh is the resistance of the channel layers 13b and 14. Since the resistance Rn$^+$ is smaller than the resistance Rsh, the source resistance Rs and the drain resistance Rd can be reduced by providing the convexities 18a and 20a.

Using a gradual channel approximation, a drain current Id in the non-saturated region of the FET is expressed by Equation 1.

$$Id = \frac{Wg \cdot \mu \cdot Cgs}{Lg}\left((Vg' - Vth)Vd' - \frac{1}{2}Vd'^2\right) \quad \text{(Equation 1)}$$

Wherein Wg is a gate width, μ is a mobility of the 2DEG 17, Cgs is a gate-source capacitance, Lg is a gate length, Vth is a threshold voltage, Vg' is an effective gate voltage, Vd' is an effective drain voltage, Vg is a gate voltage, Vd is a drain voltage, Rs is the source resistance, and Rd is the drain resistance.

The gate width Wg is proportional to the number of gates 26. The gate length Lg corresponds to the length of the region 32a in the X direction. The gate voltage Vg and the drain voltage Vd are voltages applied to the gate 26 and the drain electrode 24 with respect to the source electrode 22, respectively. The effective gate voltage Vg' and the effective drain voltage Vd' are voltages effectively applied to the region 32a.

The effective gate voltage Vg' is expressed by Equation 2.

$$Vg'=Vg-Id\times Rs \quad \text{(Equation 2)}$$

The effective drain voltage Vd' is expressed by Equation 3.

$$Vd'=Vd-Id\times(Rs+Rd) \quad \text{(Equation 3)}$$

When the source resistance Rs and the drain resistance Rd decrease as in Equations 2 and 3, the effective gate voltage Vg' and the effective drain voltage Vd' become closer to the gate voltage Vg and the drain voltage Vd. Thereby, the drain current Id increases as in Equation 1. That is, the on-resistance becomes small. Further, since the drain current Id is saturated by the small drain voltage Vd, the knee voltage can be reduced. In this way, the FET characteristics can be improved by providing the convexity 20a.

From the viewpoint of reducing the parasitic capacitance Cgdf, the length Lb of the convexity 20a in the X direction is preferably the distance Lgd or less between the gate 26 and the drain region 20 on the straight line 46, and more preferably 0.8×Lgd or less. From the viewpoint of reducing the drain resistance Rd, the length Lb is preferably ¹⁄₁₀×Lgd or more, and more preferably ⅕×Ldg or more. From the viewpoint of reducing the drain resistance Rd, the convexity 20a preferably overlaps with the straight line 44, the minimum width Wb1 of the convexity 20a in the Y direction is preferably ¹⁄₁₀×W1 or more, and the maximum width Wb2 of the convexity 20a in the Y direction is preferably ¹⁄₁₀×W2 or more. From the viewpoint of reducing the parasitic capacitance Cgdf, the convexity 20a preferably does not overlap with the straight line 46, the width Wb1 is preferably ½×W1 or less, and the width Wb2 is preferably ½×W2 or less.

The planar shape of the convexity 20a may be a shape in which a plurality of rectangles are connected in the X direction as in the convexity 18a of the second variation of the first embodiment. The planar shape of the convexity 20a may be substantially rectangular as in the third variation of the first embodiment. The width of the convexity 20a in the Y direction preferably narrows from the drain region 20 toward the source region 18. The width of the convexity 20a in the Y direction may gradually be narrowed from the drain region 20 toward the source region 18. The width of the convexity 20a in the Y direction may be narrowed stepwise from the drain region 20 toward the source region 18.

Fifth Variation of First Embodiment

Figure 16:
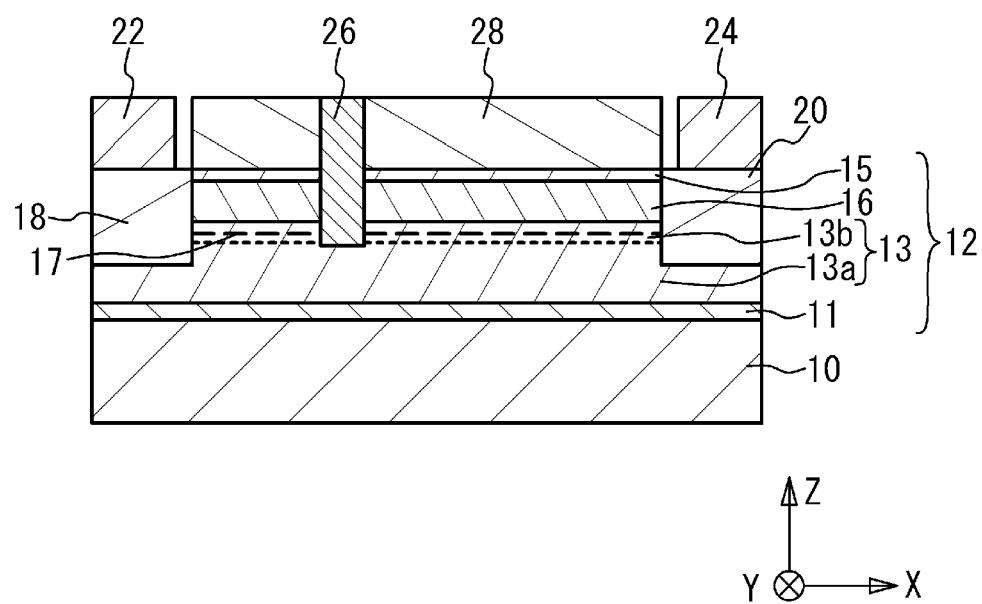
FIG. 16 is an enlarged plan view of a semiconductor device according to a fifth variation of the first embodiment.

FIG. 16 is an enlarged plan view of a semiconductor device according to a fifth variation of the first embodiment. In the fifth variation of the first embodiment, the semiconductor layer 12 includes one channel layer 13b and the barrier layer 16 as illustrated in FIG. 16. Other configurations are the same as those in the first embodiment, and the description thereof will be omitted.

As in the first embodiment and the first to fifth variations thereof, the semiconductor layer 12 is a HEMT (High Electron Mobility Transistor) in which the channel layers 13b and 14 and the barrier layer 16 are laminated. An energy of the bottom of a conduction band in the barrier layer 16 is higher than the energy of the bottom of the conduction band in the channel layers 13b and 14. Thereby, the 2DEG 17 is formed in the channel layers 13b and 14. Since the 2DEG 17 has high mobility, the on-resistance in the non-saturated region can be reduced and the knee voltage can be reduced as in Equation 3. It is preferable that the channel layers 13b and 14 are intentionally free of impurities. For example, the impurity concentration is 1×10$^{15}$ cm$^{-3}$ or less. Thereby, the 2DEG can have higher mobility, and can reduce the on-resistance and the knee voltage.

As in the fifth variation of the first embodiment, the channel layer 13b may be one layer. However, as in the first embodiment and the first to fourth variations thereof, the semiconductor layer 12 preferably has a plurality of laminated channel layers 13b and 14. Thereby, the drain current can be increased and the power density can be increased. When the semiconductor layer 12 has the plurality of channel layers 13b and 14, if the gates are provided on the semiconductor layer 12, it becomes difficult to control the channel layers 13b and 14. Embedding the gates 26 in the semiconductor layer 12 makes it easier to control the channel layers 13b and 14, as illustrated in FIGS. 6 and 7. However, the parasitic capacitance Cgsf becomes large. Therefore, it is preferable to provide the convexity 18a in the source region 18.

Although the example of the GaN layer as the channel layers 13b and 14 and the AlGaN layer as the barrier layer 16 is described, the channel layers 13b and 14 may be the InGaN layer. Further, the channel layers 13b and 14 may be a GaAs layer or an InGaAs layer, and the barrier layer 16 may be an AlGaAs layer. In this way, the semiconductor layer 12 may be a compound semiconductor layer.

Sixth Variation of First Embodiment

Figure 17:
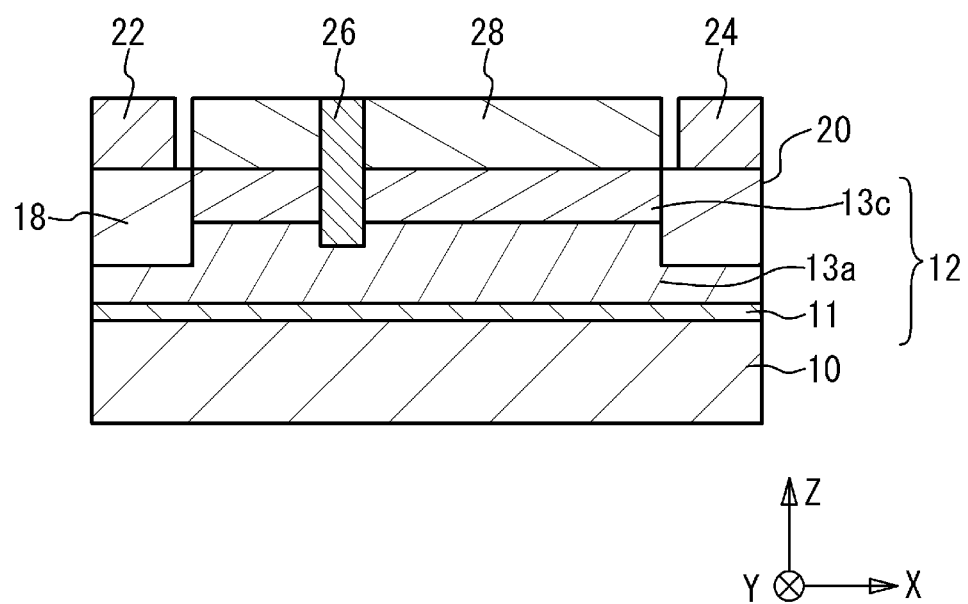
FIG. 17 is an enlarged plan view of a semiconductor device according to a sixth variation of the first embodiment.

FIG. 17 is an enlarged plan view of a semiconductor device according to a sixth variation of the first embodiment. In the sixth variation of the first embodiment, the semiconductor layer 12 is provided with a channel layer 13c on the buffer layer 13a, as illustrated in FIG. 17. For example, silicon is added to the channel layer 13c as the dopant. The dopant concentration of the channel layer 13c is, for example, $1 \times 10^{17}$ cm$^{-3}$ or more. Other configurations are the same as those in the first embodiment, and the description thereof will be omitted. As in the sixth variation of the first embodiment, the semiconductor device may be a MESFET (Metal Semiconductor FET).

It should be considered that the above embodiments disclosed here are exemplary in all respects and not restrictive. The scope of the present invention is not limited to the specific embodiments of the disclosure. It is to be understood that the scope of the present invention is defined in the appended claims and includes equivalence of the description of the claims and all changes within the scope of the claims.

The invention claimed is:

1. A semiconductor device comprising"
    a semiconductor layer provided on a substrate and including a channel layer;
    a source region connected to the channel layer and having a sheet resistance smaller than a sheet resistance of the channel layer;
    a drain region connected to the channel layer and having a sheet resistance smaller than the sheet resistance of the channel layer;
    a plurality of gates provided between the source region and the drain region, arranged in a direction intersecting an arrangement direction of the source region and the drain region, and embedded from an upper surface of the semiconductor layer to at least the channel layer;
    wherein a part of the source region has a convexity that faces a region between two adjacent gates among the plurality of gates, and protrudes toward a part of the drain region through the region between the two adjacent gates, and
    wherein a width of the convexity narrows from the part of the source region toward the drain region.

2. The semiconductor device according to claim 1, wherein
    the convexity does not overlap first straight lines extending in the arrangement direction through the centers of the two adjacent gates, but overlaps a second straight line extending in the arrangement direction through a midpoint between the two adjacent gates in a plan view.

3. The semiconductor device according to claim 2, wherein
    a length of the convexity in the arrangement direction is $\frac{1}{10}$ or more and 1 or less of a distance between the source region and each of the two adjacent gates on the first straight lines.

4. The semiconductor device according to claim 1, wherein
    the width of the convexity gradually narrows from the part of the source region toward the drain region.

5. The semiconductor device according to claim 1, wherein
    the width of the convexity narrows stepwise from the part of the source region toward the drain region.

6. The semiconductor device according to claim 1, wherein
    the part of the drain region through the region between the two adjacent gates has another convexity that projects toward the part of the source region.

7. The semiconductor device according to claim 6, wherein
    the another convexity does not overlap first straight lines extending in the arrangement direction through the centers of the two adjacent gates, but overlaps a second straight line extending in the arrangement direction through a midpoint between the two adjacent gates in a plan view.

8. The semiconductor device according to claim 7, wherein
    a length of the another convexity in the arrangement direction is $\frac{1}{10}$ or more and 1 or less of a distance between the drain region and each of the two adjacent gates on the first straight lines.

9. The semiconductor device according to claim 6, wherein
    a width of the another convexity narrows from the part of the drain region toward the part of source region.

10. The semiconductor device according to claim 1, wherein
    the semiconductor layer has an energy of the bottom of a conduction band higher than an energy of the bottom of a conduction band in the channel layer, and includes a barrier layer laminated on the channel layer.

11. The semiconductor device according to claim 1, wherein
    the semiconductor layer includes a plurality of laminated channel layers.

* * * * *